United States Patent

Chen et al.

[11] Patent Number: 5,953,248
[45] Date of Patent: Sep. 14, 1999

[54] LOW SWITCHING FIELD MAGNETIC TUNNELING JUNCTION FOR HIGH DENSITY ARRAYS

[75] Inventors: Eugene Chen, Gilbert; Saied N. Tehrani, Tempe, both of Ariz.

[73] Assignee: Motorola, Inc., Schaumburg, Ill.

[21] Appl. No.: 09/118,979

[22] Filed: Jul. 20, 1998

[51] Int. Cl.$^6$ .......................... G11C 11/00; G11C 11/15
[52] U.S. Cl. .......................... 365/158; 365/171; 365/173
[58] Field of Search .................. 365/158, 173, 365/171

[56] References Cited

U.S. PATENT DOCUMENTS

| 5,640,343 | 6/1997 | Gallagher et al. | 365/171 |
| 5,650,958 | 7/1997 | Gallagher et al. | 365/173 |
| 5,729,410 | 3/1998 | Fontana, Jr. et al. | 365/158 |
| 5,734,605 | 3/1998 | Zhu et al. | 365/173 |
| 5,764,567 | 6/1998 | Parkin | 365/173 |
| 5,768,181 | 6/1998 | Zhu et al. | 365/158 |
| 5,801,984 | 9/1998 | Parkin | 365/158 |
| 5,828,598 | 10/1998 | Chen et al. | 365/158 |
| 5,841,692 | 11/1998 | Gallagher et al. | 365/173 |

*Primary Examiner*—Trong Phan
*Attorney, Agent, or Firm*—Eugene A. Parsons; William E. Koch

[57] ABSTRACT

A low switching field magnetic tunneling junction memory cell including an antiferromagnetically coupled structure having first and second magnetoresistive layers of different thicknesses and a non-magnetic conducting layer sandwiched therebetween so that the magnetic vectors of the pair of layers are anti-parallel with no applied magnetic field, a magnetoresistive structure having a magnetic vector, and electrically insulating material sandwiched between the antiferromagnetically coupled structure and the magnetoresistive structure to form a magnetic tunneling junction.

12 Claims, 1 Drawing Sheet

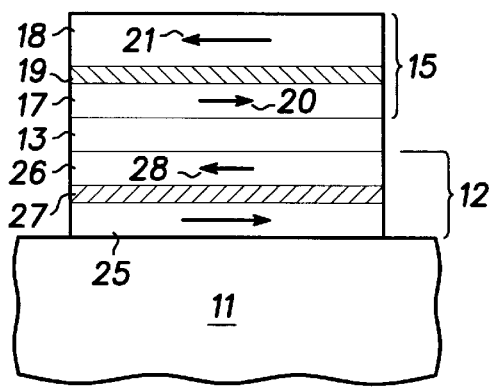
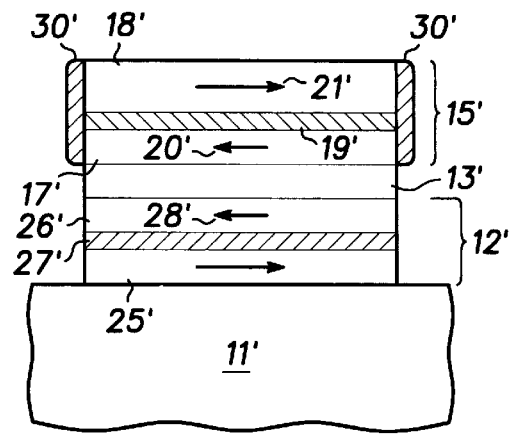
FIG. 1 10  FIG. 2 10'
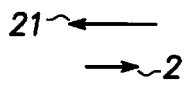 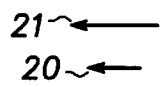 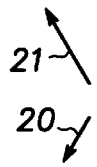
FIG. 3  FIG. 4  FIG. 5
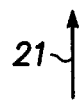  
FIG. 6  FIG. 7  FIG. 8
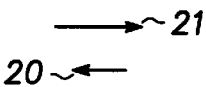
FIG. 9
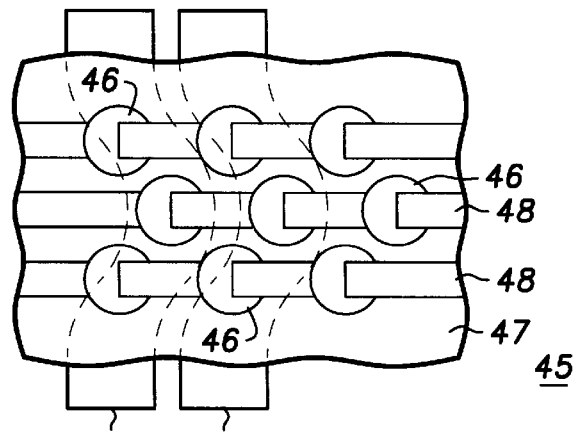
FIG. 10

LOW SWITCHING FIELD MAGNETIC TUNNELING JUNCTION FOR HIGH DENSITY ARRAYS

FIELD OF THE INVENTION

The present invention pertains to magnetic tunneling junctions for memory cells and more specifically to very small magnetic junctions for very high density arrays of memory cells.

BACKGROUND OF THE INVENTION

A magnetic random access memory (MRAM) is a non-volatile memory which basically includes a giant magnetoresistive (GMR) material or magnetic tunneling junction (MTJ) structure, a sense line, and a word line. The MRAM employs the magnetic vectors to store memory states. Magnetic vectors in one or all of the layers of GMR material or MTJ are switched very quickly from one direction to an opposite direction when a magnetic field is applied to the magnetic material over a certain threshold or intensity. According to the direction of the magnetic vectors in the GMR material or MTJ, states are stored, for example, one direction can be defined as a logic "0", and another direction can be defined as a logic "1". The GMR material or MTJ maintains these states even without a magnetic field being applied. The states stored in the GMR material or MTJ can be read by passing a sense current through the cell in a sense line because of the difference between the resistances of the two states.

In very high density arrays of magnetic memory cells the size of individual cells becomes very small if the array is constructed small enough to be useful in present day electronic devices. As the size of individual cells becomes smaller the aspect ratio (length/width ratio) generally becomes smaller. In two layer magnetic memory cells, e.g. standard tunneling cells, as the aspect ratio goes below 5, magnetic vectors in the cells are antiparallel in non-energized (zero magnetic field) conditions. In a copending application entitled "Multi-Layer Magnetic Memory Cells with Improved Switching Characteristics", Ser. No. 08/723,159, filed on Sep. 25, 1996, and assigned to the same assignee, methods of reading cells with antiparallel magnetic vectors are disclosed. Also, in a copending application entitled "Magnetic Device Having Multi-Layers with Insulating and Conductive Layers", Ser. No. 08/834,968, filed on Apr. 7, 1997, and assigned to the same assignees, a dummy magnetic layer is added to a two magnetic layer stack and coupled to one of the two magnetic layers so that the other magnetic layer is a free layer. A drawback of the dummy magnetic layer approach is that it relies on cancellation of magnetostatic interaction between the two magnetic layers and this magnetostatic interaction strength depends on the geometry of the cell and the interlayer spacing. These parameters change as the critical dimension shrinks.

Also, in two layer magnetic memory cells, e.g. standard tunneling cells, as the aspect ratio goes below 5, the amount of magnetic field required for switching states of the cell increases dramatically. Generally, as the cells are made smaller the layers of the cells are made thinner to reduce the amount of magnetic field required for switching states of the cell, since the magnetic moment (determined by the material) times the thickness of the layer determines the required switching field. Softer magnetic material can also be used to reduce the magnetic moment but the reduction in switching field is limited for ultra small memory cells. Also, as the cells are made smaller they become unstable because, for example, when the size of the memory cell is 10 nm or less, the energy barrier of the magnetization, which is proportional to the cell volume, is decreased due to the decreased volume and is close to the thermal fluctuation energy, which is KT.

Accordingly, it is highly desirable to provide magnetic random access memories and memory cells which are capable of being written (stored states switched) with less magnetic field and which have a volume sufficient to not be effected by the thermal fluctuation energy.

It is another purpose of the present invention to provide a new and improved multi-state, multi-layer magnetic memory cell with ferromagnetically coupled magnetic layers designed to reduce the required switching field.

It is still another purpose of the present invention to provide a new and improved multi-state, multi-layer magnetic memory cell with ferromagnetically coupled magnetic layers which can be fabricated very small and with an aspect ratio less than 5.

It is a still further purpose of the present invention to provide a new and improved multi-state, multi-layer magnetic memory cell with an increased energy barrier of magnetization.

SUMMARY OF THE INVENTION

The above problems and others are at least partially solved and the above purposes and others are realized in a low switching field magnetoresistive tunneling junction memory cell including a antiferromagnetically coupled multi-layer structure having first and second magnetoresistive layers with a non-magnetic conducting layer situated in parallel juxtaposition between the pair of magnetoresistive layers. The pair of magnetoresistive layers in the antiferromagnetically coupled multi-layer structure are constructed to switch at different magnetic fields, by having different thicknesses or different magnetic material. Also, the pair of magnetoresistive layers in the antiferromagnetically coupled multi-layer structure each have a magnetic vector which are anti-parallel with no applied magnetic field due to the antiferromagnetic coupling of the pair of layers and the aspect ratio. The cell further includes a magnetoresistive structure having a magnetic vector with a fixed relationship to the vector of the second magnetoresistive layer. Electrically insulating material is situated in parallel juxtaposition between the antiferromagnetic coupled multi-layer structure and the magnetoresistive structure to form a magnetic tunneling junction.

Basically, the magnetic field required to switch states in the cell is dictated by the difference between the two magnetoresistive layers in the antiferromagnetically coupled multi-layer structure. Also, each of the first and second structures have, or can be constructed to have, little net magnetic moment and, hence, the memory cell has little net magnetic moment so that it can be positioned closer to adjacent cells without affecting adjacent cells.

BRIEF DESCRIPTION OF THE DRAWINGS

Referring to the drawings:

FIG. 1 is a simplified side view of a low switching field magnetic tunneling junction memory cell in accordance with the present invention;

FIG. 2 is a view similar to FIG. 1 illustrating a different mode and a modification;

FIG. 3 through FIG. 9 illustrate steps in switching the low switching field magnetic tunneling junction memory cell from the mode of FIG. 1 to the mode of FIG. 2; and FIG. 10 is a simplified view in top plan of an array of low switching field magnetic tunneling junction memory cell in accordance with the present invention.

DESCRIPTION OF THE PREFERRED EMBODIMENT

Turning now to the drawings, FIG. 1 illustrates an enlarged, simplified side view of a low switching field magnetic tunneling junction memory cell 10 in accordance with the present invention. Magnetic tunneling junction 10 is generally formed on a supporting substrate 11 and includes a magnetoresistive structure 12 supported on substrate 11, an electrically insulating material layer 13 positioned on structure 12, and a magnetoresistive structure 15 positioned on electrically insulating material layer 13 so as to sandwich layer 13 between magnetoresistive structures 12 and 15 and form a tunneling junction.

Magnetoresistive structure 15 is comprised of an antiferromagnetically coupled multi-layer structure including magnetoresistive layers 17 and 18 having a nonmagnetic conducting layer 19 situated in parallel juxtaposition between magnetoresistive layers 17 and 18. Magnetoresistive layer 17 has a magnetic vector 20 lying along a preferred magnetic axis parallel to the planar surface of substrate 11 and magnetoresistive layer 18 has a magnetic vector 21. Magnetic vectors 20 and 21 are antiparallel with no magnetic field applied to magnetic tunneling junction 10, due to the antiferromagnetic coupling between magnetoresistive layers 17 and 18 and/or an aspect ratio less than approximately 5. Generally, in cells having a length/width ratio of less than approximately 4 the layers of magnetic material (Layers 17 and 18 in FIG. 1) are antiferromagnetically coupled. Generally, for purposes of this disclosure the term "antiferromagnetically coupled" means that either of the antiparallel states (illustrated in FIGS. 1 and 2) is stable and that the parallel state is unstable and does require a constant magnetic field, since the magnetic vectors always tend to move to an antiparallel state (pointing in opposite directions). Depending upon the construction, shape and size of magnetoresistive structure 15, vectors 20 and 21 can be constrained to lie along the preferred magnetic axis by either shape or magnetic crystalline anisotropy.

In the case of circularly shaped cells, for example, the preferred magnetization direction can be determined by uniaxial crystal field anisotropy (or magnetic crystalline anisotropy). This preferred magnetization direction is set during film deposition by a bias field or by annealing the film after deposition in a high magnetic field (e.g. several kOe) at elevated temperatures (e.g. 200° C. to 300° C.). In the case of a square or diamond shape, the uniaxial crystal anisotropy can be set along a diagonal direction of the square. In the case of an elliptically or rectangularly shaped cell, the uniaxial crystal anisotropy can be set along the long axis of the cell. A preferred feature here is to minimize the shape effect, which contributes to the rise in required switching fields at narrow cell widths, and to utilize magneto-crystalline anisotropy to set the preferred magnetization direction needed by a memory cell.

Also, magnetoresistive layer 17 is constructed to switch direction of magnetic vector 20 at a different magnetic field intensity than the switching of magnetic vector 21 of magnetoresistive layer 18. This feature can be accomplished in several different ways, including by forming layer 17 thinner (with less material) than layer 18, as shown in FIG. 1, by forming layer 17 with different magnetization (e.g. forming layer 17 of softer magnetic material than layer 18), or some combination of the size and magnetization.

Magnetoresistive layers 17 and 18 each can be single layers of ferromagnetic materials such as a layer of nickel, iron, cobalt, or alloys thereof including alloys having palladium or platinum therein. Alternatively, either of layers 17 and 18 can be a composite ferromagnetic layer, such as a layer of nickel-iron-cobalt covering a layer of cobalt-iron or three layer structures including layers of cobalt-iron and nickel-iron-cobalt and cobalt-iron with cobalt-iron at the interface with adjacent layers. Materials that are suitable for non-magnetic conducting layer 19 include most electrically conductive materials such as copper and the like.

Magnetoresistive structure 12, including at least one magnetoresistive layer having a magnetic vector parallel to the preferred magnetic axis, is positioned on substrate 11 with electrically insulating material layer 13 situated in parallel juxtaposition between structures 12 and 15 to form magnetic tunneling junction 10. In FIG. 1, magnetoresistive structure 12 is illustrated as similar to structure 15 and includes magnetoresistive layers 25 and 26 separated by a non-magnetic conducting layer 27. Here it should be noted that only layers 17 and 26, adjacent to electrically insulating material layer 13, contribute to the magnetoresistance or mode changes of magnetic tunneling junction 10. Magnetoresistive layer 26 has a magnetic vector 28 which, generally, in the operation of magnetic tunneling junction 10, is fixed in one direction along the preferred magnetic axis. Thus, magnetoresistive structure 12 can have substantially any configuration that includes a magnetoresistive layer with a fixed magnetic vector adjacent electrically insulating material layer 13 to produce a magnetic tunneling junction and which, preferably has a substantially zero magnetic moment to produce a minimum effect on adjacent cells.

In a tunneling junction type of magnetic cell, layer 13 is a barrier or tunneling layer, the provision of which between antiferromagnetic layers 17 and 26 produces a tunneling junction that allows a flow of current perpendicularly through layer 13, from layer 17 to layer 26 (or vice versa). Essentially, magnetic tunneling junction 10 appears as a relatively high impedance (referred to herein as a resistance R), which has dependence on the square area of the cell and the dielectric structure, generally several thousand ohms, e.g. 10 to 1000 kohms. When the magnetization vectors in layers 17 and 26 are antiparallel, as illustrated in FIG. 1, the resistance R of magnetic tunneling junction 10 remains very high. When the magnetization vectors in layers 17 and 26 are parallel, as illustrated in FIG. 2, the resistance R of magnetoresistive tunneling junction 10 drops perceptibly.

In a specific example, layer 17 is formed of cobalt (Co) approximately 50 Å thick, layer 13 is formed of aluminum oxide ($Al_2O_3$) approximately 15 Å thick, and layer 26 is formed of nickel iron (NiFe) approximately 50 Å thick. Layer 18, which in this example is thicker than layer 17, is approximately 60 Å thick and layer 25, if present, has a similar thickness. The state of magnetic tunneling junction 10 is relatively easily sensed by passing a sense current therethrough from layer 18 to layer 25 (or vice versa). The change of resistance in magnetic tunneling junction 10 is easily read as a change in voltage drop across magnetic tunneling junction 10 which can conveniently be used in conjunction with memory arrays and the like.

Referring specifically to FIG. 2, a structure similar to that of FIG. 1 is illustrated in a different mode, and a slightly different embodiment is illustrated with similar components being designated with similar numbers having a prime added to indicate the different embodiment. In this embodiment, the antiparallel coupling between layers 17' and 18' of structure 15' is reinforced by the addition of flux closure material 30' positioned to enclose exposed edges of layers 17', 18' and 19'. Flux closure material 30' is any soft magnetic material which encloses flux lines, or completes a magnetic circuit, between the various layers. Soft magnetic material 30' simply guides magnetic field lines from layers 17' and 18', respectively, into a closed loop to further reduce the end magnetic poles and greatly reduce stray magnetic fields. Similar flux closure material can be used in conjunction with layers 25', 26', and 27' if the layers are present.

Turning now to FIGS. 3 through 9, several steps are illustrated in switching low switching field magnetic tunneling junction memory cell 10 from the mode of FIG. 1 to the mode of FIG. 2. Specifically, FIG. 3 illustrates vector 20 of magnetoresistive layer 17 and vector 21 of magnetoresistive layer 18 in the antiparallel position of FIG. 1. In this position vector 20 is also antiparallel to vector 28 of magnetoresistive layer 26 so that magnetic tunneling junction memory cell 10 is in the high resistance mode. To switch magnetic tunneling junction memory cell 10 to the low resistance mode (illustrated in FIG. 2), an initial small magnetic field is applied to magnetic tunneling junction memory cell 10 sufficient to switch vector 20 into a parallel position with vector 21, as illustrated in FIG. 4. A larger positive magnetic field is then applied to magnetoresistive tunneling junction memory cell 10, which causes vectors 20 and 21 to rotate in opposite directions 180°, as denoted by the transitional states illustrated in FIGS. 5, 6, and 7, respectively. Finally, vectors 20 and 21 are switched into the opposite direction illustrated in FIG. 8 and, when the magnetic field is removed, vector 20 again assumes an antiparallel state, illustrated in FIG. 9. The antiparallel state illustrated in FIG. 9 is a stable state and, represents the low resistance mode of magnetic tunneling junction memory cell 10.

Because magnetic vectors 20 and 21 of magnetoresistive layers 17 and 18 rotate in opposite directions 180°, the magnetic moments tend to offset each other and a minimum amount of magnetic field is required to perform the switching operation. The amount of switching magnetic field required to perform the switching operation is primarily dependent upon the difference in thickness or material between magnetoresistive layers 17 and 18. That is, because the stable modes for vectors 20 and 21 are antiparallel, by forming one of layers 17 and 18 so that it switches at a different magnetic field intensity than the other of layers 17 and 18, the mode switching results in rotation of vectors 20 and 21 in opposite directions with the resulting advantageous offsetting magnetic moments.

Some additional advantages that are realized by the present structure is the fact that the antiparallel vectors 20 and 21 result in very little total magnetic moment for magnetoresistive tunneling junction memory cell 10. This low magnetic moment is further enhanced by the flux closure material 30' illustrated in FIG. 2. Also, when the size of the magnetoresistive tunneling junction memory cell approaches 10 nm, the energy barrier of the magnetization (which is proportional to the volume) is close to the thermal fluctuation energy (KT). This causes the cell to be unstable. In the present invention the switching field can be reduced substantially without reducing the total size to an unstable level. Thus, an advantage of having two layers switching in opposite directions at the same time is that the switching field is determined by the difference in thickness between the two switching layers or, more accurately, the difference between the product of thickness and magnetization. Thus, both layers can be sufficiently thick so that the energy barrier for the two different magnetic states is higher than the thermal fluctuation energy.

Turning now to FIG. 10, a simplified view in top plan is illustrated of an high density array 45 of low switching field magnetoresistive tunneling junction memory cells 46 in accordance with the present invention. Array 45 is formed on a substrate structure 47 which may include control electronics and other peripheral equipment, if practical. Also, if an antiferromagnetic layer or the like is included as part of substrate structure 47 to pin vector 28 of structure 12 in a fixed position, the layer may be formed as a blanket layer so as to cooperate with each cell 46. Cells 46 lying in a common row, for example, have the top magnetic layer connected to the bottom magnetic layer of the adjacent cell to form a common sense line 48. Further, word lines 49, illustrated in broken lines, are coupled to cells 46 lying in a common column for purposes of writing information into the cells, as described above. Because of the zero, or essentially zero, magnetic moment of cells 10, cells of this type can be positioned very close and the density of an array of these cells can be greatly increased.

Thus, new and improved magnetic random access memories and memory cells which are capable of being written (stored states switched) with less magnetic field have been disclosed. Also, the new and improved multi-state, multi-layer magnetic memory cell with antiferromagnetically coupled magnetic layers is capable of being written (stored states switched) with less magnetic field and has a volume sufficient to not be effected by the thermal fluctuation energy. Further, the new and improved multi-state, multi-layer magnetic memory cell with antiferromagnetically coupled magnetic layers which is disclosed produces less magnetic interaction with adjacent cells in an array and can be fabricated very small and with an aspect ratio less than 5. Further, the new and improved multi-state, multi-layer magnetic memory cell is simpler to manufacture and to use and, because of its size, results in a high density array of cells. of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A low switching field magnetic tunneling junction memory cell comprising:

a first antiferromagnetically coupled multi-layer structure including first and second magnetoresistive layers having a first non-magnetic conducting layer situated in parallel juxtaposition between the first and second magnetoresistive layers, the first magnetoresistive layer having a first magnetic vector and the second magnetoresistive layer having a second magnetic vector with the first and second magnetic vectors being anti-parallel with no applied magnetic field, and the first magnetoresistive layer being constructed to switch direction of the first magnetic vector at a different magnetic field intensity than the second magnetic vector of the second magnetoresistive layer;

a second structure including at least one magnetoresistive layer having a magnetic vector parallel with one of the first and second magnetic vectors of the first antiferromagnetically coupled multi-layer structure; and electrically insulating material situated in parallel juxtaposition between the first and second structures to form a magnetoresistive tunneling junction.

2. A low switching field magnetic tunneling junction memory cell as claimed in claim 1 wherein the first and second structures have a length/width ratio in a range of 1 to 5.

3. A low switching field magnetic tunneling junction memory cell as claimed in claim 2 wherein the first and second structures have a top plan that is one of circular, diamond-shaped, or elliptical.

4. A low switching field magnetic tunneling junction as claimed in claim 1 wherein the first and second magnetoresistive layers have different thicknesses for switching at different switching fields.

5. A low switching field magnetic tunneling junction memory cell as claimed in claim 1 wherein the first and second magnetoresistive layers have different magnetizations for switching at different switching fields.

6. A low switching field magnetic tunneling junction memory cell as claimed in claim 1 including in addition flux closure material positioned to enclose exposed edges of the first antiferromagnetically coupled multi-layer structure.

7. A low switching field magnetic tunneling junction memory cell as claimed in claim 1 wherein the first and second magnetic vectors are anti-parallel with no applied magnetic field due to one of antiferromagnetic coupling between the first and second magnetoresistive layers and an aspect ratio of the cell.

8. A high density array of low switching field magnetic tunneling junction memory cells comprising:

a substrate with a planar surface; and a plurality of interconnected low switching field magnetoresistive tunneling junction memory cells supported on the planar surface of the substrate and interconnected to form a memory array, each cell of the plurality of cells having an aspect ratio less than 5 and a top plan that is one of circular, diamond-shaped, or elliptical, each cell including a first antiferromagnetically coupled multi-layer structure including first and second magnetoresistive layers having a first non-magnetic conducting layer situated in parallel juxtaposition between the first and second magnetoresistive layers, the first magnetoresistive layer having a first magnetic vector and the second magnetoresistive layer having a second magnetic vector with the first and second magnetic vectors being anti-parallel with no applied magnetic field, and the first magnetoresistive layer being constructed to switch direction of the first magnetic vector at a different magnetic field intensity than the second magnetic vector of the second magnetoresistive layer;

a second structure including at least one magnetoresistive layer having a magnetic vector parallel with one of the first and second magnetic vectors of the first antiferromagnetically coupled multi-layer structure; and electrically insulating material situated in parallel juxtaposition between the first antiferromagnetically coupled multi-layer structure and the second structure to form a magnetoresistive tunneling junction.

9. A high density array of low switching field magnetic tunneling junction memory cells as claimed in claim 8 wherein the first and second magnetoresistive layers have different thicknesses for switching at different switching field intensities.

10. A high density array of low switching field magnetic tunneling junction memory cells as claimed in claim 8 wherein the first and second magnetoresistive layers have different magnetizations for switching at different switching field intensities.

11. A high density array of low switching field magnetic tunneling junction memory cells as claimed in claim 8 including in addition flux closure material positioned to enclose exposed edges of the first antiferromagnetically coupled multi-layer structure in each cell of the plurality of cells.

12. A low switching field magnetic tunneling junction memory cell as claimed in claim 8 wherein the first and second magnetic vectors are anti-parallel with no applied magnetic field due to one of antiferromagnetic coupling between the first and second magnetoresistive layers and an aspect ratio of the cell.

* * * * *

UNITED STATES PATENT AND TRADEMARK OFFICE
CERTIFICATE OF CORRECTION

PATENT NO.      : 5,953,248
DATED           : September 14, 1999
INVENTOR(S)     : Chen It is certified that error appears in the above-identified patent and that said Letters Patent is hereby corrected as shown below:

Column 1,
Line 4, after the Title, please add as a new first paragraph the following paragraph:
   -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*